United States Patent [19]
Nakajima

[11] Patent Number: 6,120,670
[45] Date of Patent: Sep. 19, 2000

[54] METHOD OF FABRICATING A MULTI-LAYERED PRINTED WIRING BOARD

[75] Inventor: Shigeki Nakajima, Toyama, Japan

[73] Assignee: NEC Corporation, Tokyo, Japan

[21] Appl. No.: 09/013,085

[22] Filed: Jan. 26, 1998

[30] Foreign Application Priority Data

Jan. 30, 1997 [JP] Japan ..................................... 9-016787

[51] Int. Cl.[7] ............................... C25D 5/02; H05K 3/00
[52] U.S. Cl. .......................... 205/125; 205/163; 205/166; 205/183
[58] Field of Search ..................................... 205/125, 126, 205/920, 163, 166, 183; 427/96, 97

[56] References Cited

U.S. PATENT DOCUMENTS

| | | | |
|---|---|---|---|
| 5,183,552 | 2/1993 | Bressel et al. | 205/158 |
| 5,575,898 | 11/1996 | Wolf et al. | 205/125 |
| 5,693,209 | 12/1997 | Bressel et al. | 205/166 |
| 5,827,386 | 10/1998 | Bhatt et al. | 156/150 |
| 5,840,363 | 11/1998 | Rosch et al. | 427/97 |

FOREIGN PATENT DOCUMENTS

| | | |
|---|---|---|
| 4118989 | 4/1992 | Japan . |
| 6224529 | 8/1994 | Japan . |
| 408204339 | 8/1996 | Japan . |
| 8204339 | 8/1996 | Japan . |

OTHER PUBLICATIONS

JPO English Abstract for JP408204339A, Aug. 9, 1996.

*Primary Examiner*—Kathryn Gorgos
*Assistant Examiner*—Wesley A. Nicolas
*Attorney, Agent, or Firm*—Hayes, Soloway, Hennessey, Grossman & Hage PC

[57] ABSTRACT

There is provided a method of fabricating a multi-layered printed wiring board, including the steps of (a) forming a multi-layered substrate with a hole which will make a blind via-hole, (b) plating the multi-layered substrate, (c) forming an internal layer circuit pattern and an external layer circuit pattern, (d) laying one multi-layered substrate on another, (e) forming a product of the step (d) with a through-hole, (f) covering surfaces of a product of the step (e) including an inner wall surface of the through-hole with an electrically conductive film, (g) forming a resist in an area other than the through-hole, (h) plating the inner wall surface of the through-hole, (i) removing the resist, and (j) removing the electrically conductive film formed on the surfaces of the product of the step (e). The above-mentioned method makes it possible to shorten a time for plating an electrically conductive film from ten hours down to only one hour, avoid short-circuit caused by plating, and reduce fabrication costs by 30–50%.

30 Claims, 7 Drawing Sheets

ULTRA-VIOLET RAY 2b

ULTRA-VIOLET RAY 2b

FIG. 3E

METHOD OF FABRICATING A MULTI-LAYERED PRINTED WIRING BOARD

BACKGROUND OF THE INVENTION

1. Field of the Invention

The invention relates to a method of fabricating a multi-layered printed wiring board having a blind via-hole.

2. Description of the Prior Art

A method of fabricating a multi-layered printed wiring board having a blind via-hole includes an additive process, a build-up process and so on. For instance, Japanese Unexamined Patent Publication No. 4-118989 has suggested a method of fabricating a multi-layered printed wiring board having a blind via-hole wherein electroless copper-plating process is employed. Hereinbelow is explained the suggested method with reference to Prior Art FIGS. 1A to 1M.

Figure 1A:
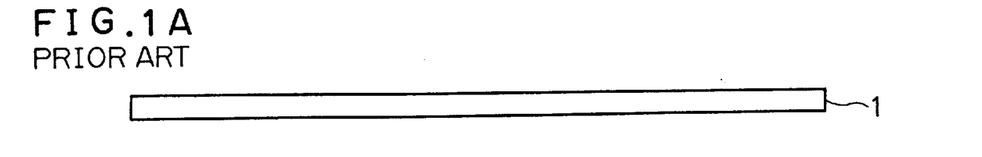
FIGS. 1A to 1M are cross-sectional views of a multi-layered printed wiring board, illustrating respective steps of a conventional method of fabricating the same.
Figure 1B:
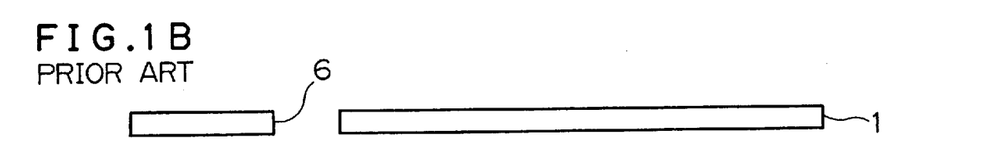
Figure 1C:
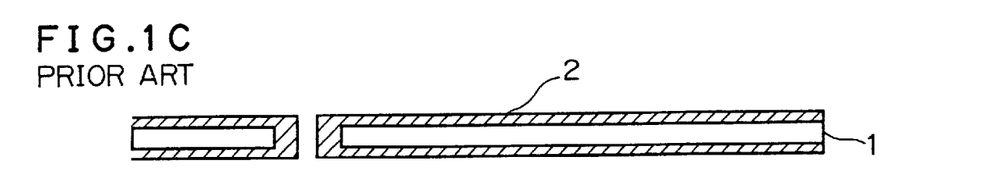

First, as illustrated in FIG. 1A, there is prepared a multi-layered insulating substrate 1 having a thickness in the range of 0.05 mm to 0.2 mm. As illustrated in FIG. 1B, the substrate 1 is formed at a desired location with a through-hole 6. Then, as illustrated in FIG. 1C, the substrate 1 is plated with copper to thereby cover upper and lower surfaces of the substrate 1 and an inner wall surface of the through-hole 6 with a copper film 2.

Figure 1D:
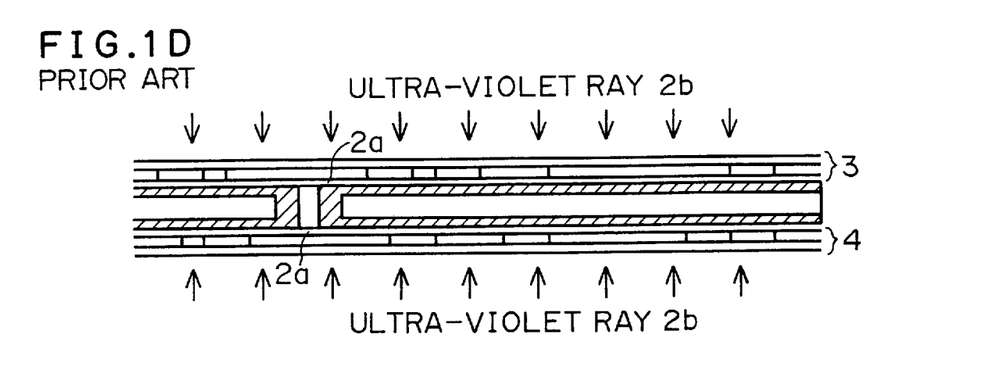

Then, as illustrated in FIG. 1D, the upper and lower surfaces of the substrate 1 is laminated with alkali-soluble dry films 2a, and thereafter, a mask film 3 for forming an external circuit layer is formed on the dry film 2a above the upper surface of the substrate 1, and a mask film 4 for forming an internal circuit layer is formed on the dry film 2a below the lower surface of the substrate 1. Then, the dry films 2a are exposed to ultra-violet ray 2b through the masks 3 and 4, as illustrated in FIG. 1D. Then, the dry films 2a are etched with copper chloride etching solution in an area other than areas which will make external and internal circuits. Subsequently, the dry films 2a covering areas which will make external and internal circuits are removed with sodium carbonate solution. Those steps are steps in a so-called tenting process. Thus, there is obtained a core on which desired external and internal circuits are formed, as illustrated in FIG. 1E.

Figure 1E:
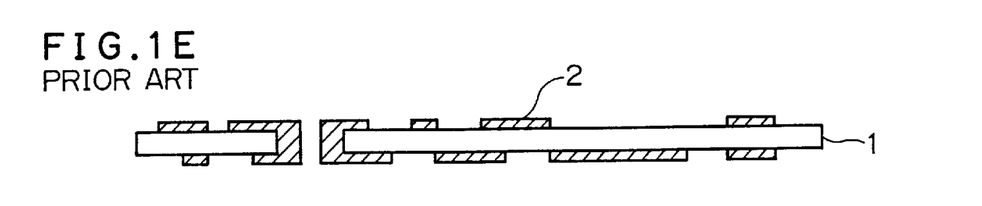
Figure 1F:
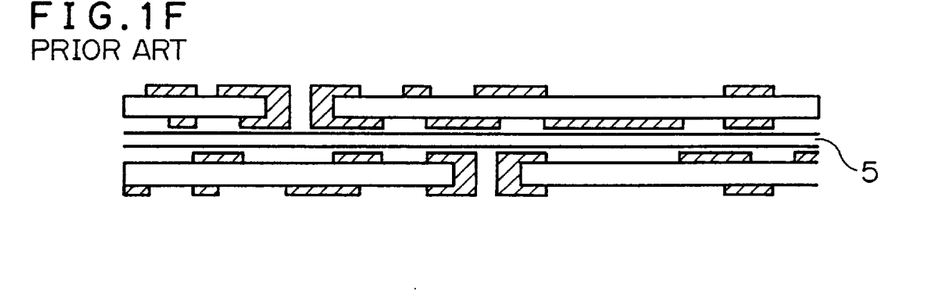
Figure 1G:
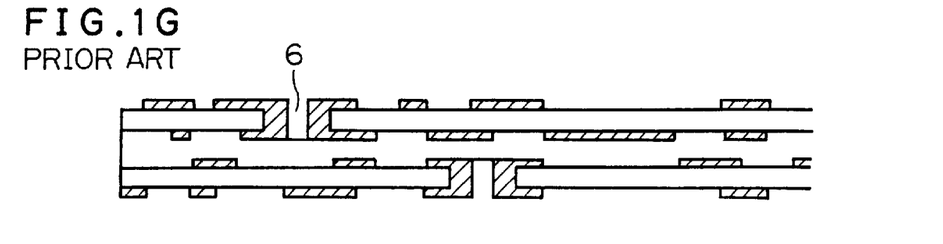

Then, one more core illustrated in FIG. 1E is formed. The two cores are thermally compressed at 180° C. for 60 minutes by means of a vacuum pressing machine with a prepreg 5 as a bonding sheet being sandwiched therebetween, as illustrated in FIG. 1F. As a result, there is formed a substrate illustrated in FIG. 1G.

Figure 1H:
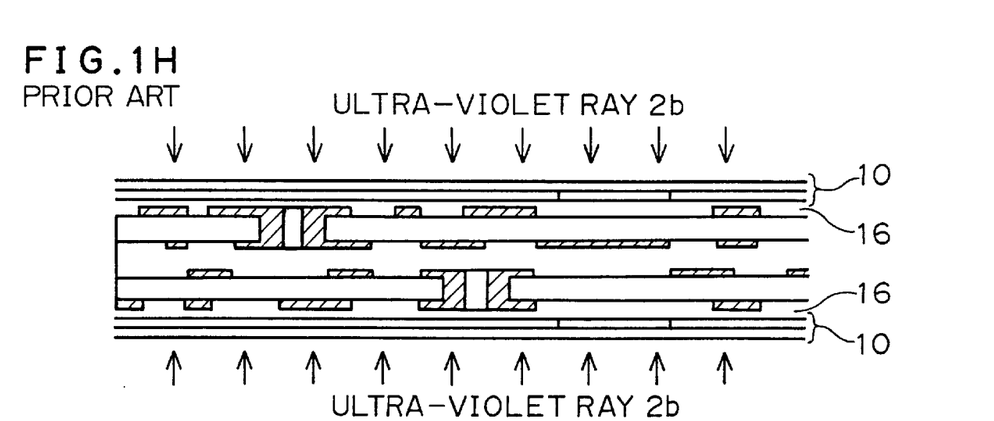
Figure 1I:
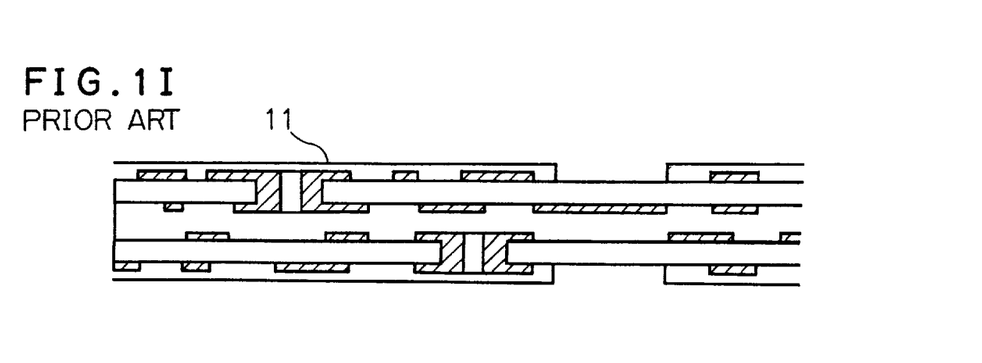

Then, as illustrated in FIG. 1H, dry films 16 are laminated over upper and lower surfaces of the substrate illustrated in FIG. 1G for the purpose of forming a plating-resist over the substrate. The dry films 16 are soluble in organic solvent, and have a thickness in the range of 25 to 50 μm. Then, mask films 10 are formed on the dry films 16. Thereafter, the dry films 16 are exposed to ultra-violet ray 2b through the mask films 10 to thereby cure a portion of the dry films 16 at which a through-hole 13 (see FIG. 1M) having a diameter in the range of 0.2 mm to 2.0 mm is to be formed. Then, an unexposed or uncured portion of the dry films 16 are developed and removed by organic solvent such as 1-1-1 trichloroethane. Thus, there is formed a plating-resist 11 covering an area other than an area at which the through-hole 13 is to be formed in the upper and lower surfaces of the substrate. FIG. 1I illustrates the substrate on which the patterned plating-resist 11 is formed.

Figure 1J:
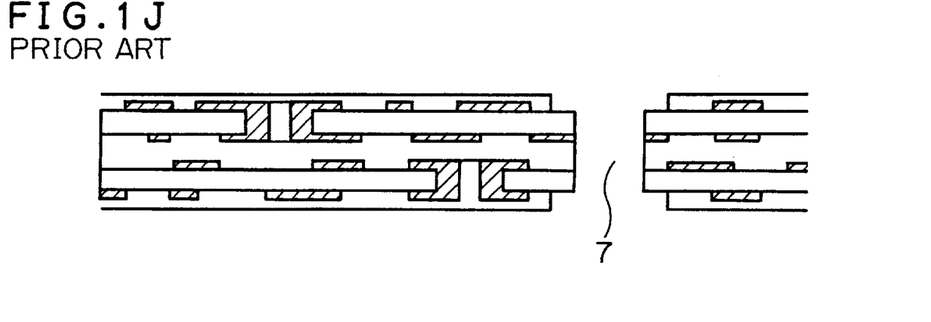
Figure 1K:
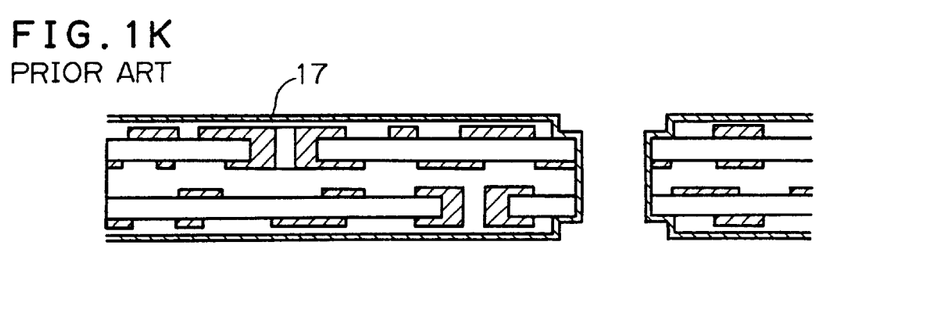
Figure 1L:
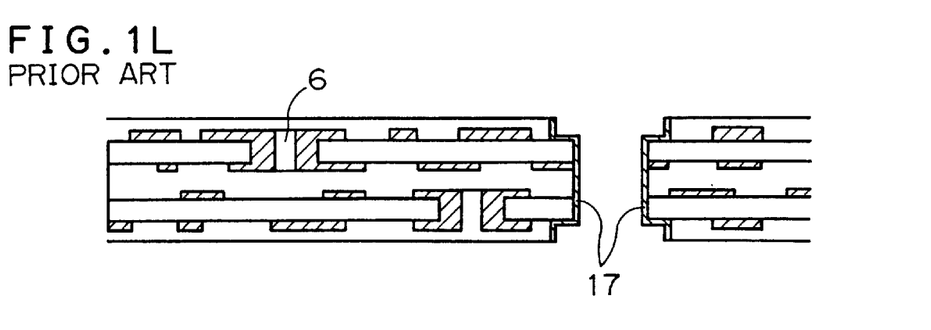

Then, as illustrated in FIG. 1J, the substrate is formed at a desired location with a through-hole 7. Then, as illustrated in FIG. 1H, a palladium catalyst film 17 is formed over both the upper and lower surfaces of the substrate and an inner wall surface of the through-hole 7. Thereafter, the palladium catalyst film 17 formed on the upper and lower surfaces of the substrate is removed by polishing. As a result, the palladium catalyst film 17 remains only on the inner wall surface of the through-hole 7, as illustrated in FIG. 1L.

Figure 1M:
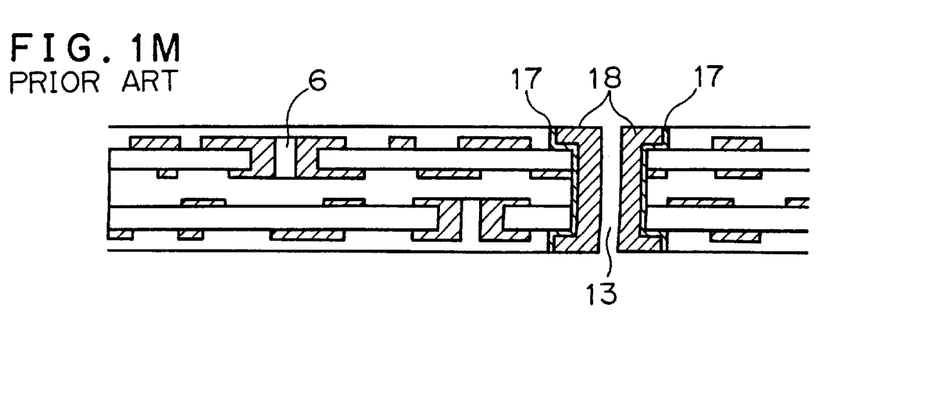

Then, in accordance with conventional electroless additive process, an electroless copper-plating film 18 is formed on the inner wall surface of the through-hole 17 by employing electroless copper-plating solution containing formalin therein, as illustrated in FIG. 1M. The copper-plating film 18 establishes electrical communication between the upper and lower surfaces of the substrate. As is obvious in FIG. 1M, the through-hole 6 becomes blind. Thus, there is completed a multi-layered printed wiring board having a blind via-hole.

In the above-mentioned conventional method of fabricating a multi-layered printed wiring board having a blind via-hole, a through-hole, an external circuit pattern, and upper and lower surfaces of a substrate are not electrically conductive, after the two cores are connected to each other by compression, as illustrated in FIG. 1F. In order to make them electrically conductive, only electroless plating may be used. However, the electroless plating is accompanied with problems of environmental pollution caused by formalin contained in electroless plating solution, and an increase in fabrication cost.

In the above-mentioned conventional method, an unnecessary portion of the palladium catalyst film 17 formed on the upper and lower surfaces of the substrate is removed by polishing, as mentioned earlier. However, it would be quite difficult or almost impossible to completely remove the palladium catalyst film 17 only by polishing.

Furthermore, since the upper and lower surfaces of the substrate is electrically communicated only by electroless copper-plating, as mentioned with reference to FIG. 1M, it takes much time to complete plating. Specifically, it takes about 10 hours for forming the copper plating film 18 by electroless copper-plating. In addition, the plating resist 11 is sometimes peeled off and/or dissolved in plating solution, resulting in a problem that a short-circuit occurrence rate caused by the plating resist 11 being peeled off and/or dissolved is quite high, specifically, in the range of 10% to 15%.

SUMMARY OF THE INVENTION

It is an object of the present invention to provide a method of fabricating a multi-layered printed wiring board, which is capable of shortening plating time, minimizing a short-circuit occurrence rate, and avoiding environmental pollution.

There is provided a method of fabricating a multi-layered printed wiring board, including the steps of (a) forming a multi-layered substrate with a hole which will make a blind via-hole, (b) plating the multi-layered substrate, (c) forming an internal layer circuit pattern and an external layer circuit pattern, (d) laying one multi-layered substrate on another, (e) forming a product of the step (d) with a through-hole, and (f) forming a plated electrically conductive film on both the external layer circuit pattern and an inner wall surface of the through-hole.

The electrically conductive film may be a non-metallic one, in which case, the non-metallic, electrically conductive film may be composed of a polymeric monomer selected from a pyrrole compound, an aniline compound, a thiophene compound, and a furan compound. As an alternative, the electrically conductive film may contain metallic particles therein.

For instance, the plated electrically conductive film in the step (f) may be formed by the steps of (f-1) forming a manganese dioxide film on surfaces of a product of the step (e) including an inner wall surface of the through-hole, and (f-2) immerging a product of the step (f-1) into pyrrole solution to thereby polymerize pyrrole and form a non-metallic, electrically conductive film composed of polypyrrole derivative.

It is preferable that the electrically conducive film has a thickness in the range of 0.05 μm to 0.5 μm both inclusive. It is also preferable that the electrically conductive film is plated by means of electrolytic-plating.

There is further provided a method of fabricating a multi-layered printed wiring board, including the steps of (a) forming a multi-layered substrate with a hole which will make a blind via-hole, (b) plating the multi-layered substrate, (c) forming an internal layer circuit pattern and an external layer circuit pattern, (d) laying one multi-layered substrate on another, (e) forming a product of the step (d) with a through-hole, (f) covering surfaces of a product of the step (e) including an inner wall surface of the through-hole with an electrically conductive film, (g) plating the external layer circuit pattern and the inner wall surface of the through-hole, and (h) removing the electrically conductive film formed on the surfaces of the product of the step (e).

For instance, the plating in the step (g) may be carried out by the steps of (i) forming a resist in an area other than the external layer circuit pattern and the through-hole, and (j) removing the resist, the step (i) being to be carried out between the steps (f) and (g), the step (j) being to be carried out between the steps (g) and (h). The plating in the step (g) is preferably electrolytic plating.

There is still further provided a method of fabricating a multi-layered printed wiring board, including the steps of (a) forming a multi-layered substrate with a hole which will make a blind via-hole, (b) plating the multi-layered substrate, (c) forming an internal layer circuit pattern and an external layer circuit pattern, (d) laying one multi-layered substrate on another, (e) forming a product of the step (d) with a through-hole, and (f) forming an electrically conductive film on the external layer circuit pattern, and forming a plated electrically conductive film on an inner wall surface of the through-hole.

There is yet further provided a method of fabricating a multi-layered printed wiring board, including the steps of (a) forming a multi-layered substrate with a hole which will make a blind via-hole, (b) plating the multi-layered substrate, (c) forming an internal layer circuit pattern and an external layer circuit pattern, (d) laying one multi-layered substrate on another, (e) forming a product of the step (d) with a through-hole, (f) covering surfaces of a product of the step (e) including an inner wall surface of the through-hole with an electrically conductive film, (g) plating the inner wall surface of the through-hole, and (h) removing the electrically conductive film formed on the surfaces of the product of the step (e).

In the above-mentioned method in accordance with the present invention, an electrically conductive film made of electrically conductive material such as polypyrrole is first formed entirely over surfaces of the deposited multi-layered substrates to thereby make the entire substrate including a through-hole electrically conductive. Thereafter, a plating-resist is formed in an area other than a through-hole and/or an external circuit layer. Then, an area on which the plating-resist is not formed is plated by electrolytic-plating. Then, an unnecessary portion of the electrically conductive film is removed by employing chromic acid, for instance. Thus, the method makes it possible to form a circuit in higher density than a conventional method in which a palladium catalyst film is incompletely removed by polishing.

The method in accordance with the present invention provides the following advantages in comparison with the above-mentioned conventional method.

First, it is possible to shorten time for plating from 10 hours down to 1 hour, because electrical communication between upper and lower surfaces of a substrate may be established by electrolytic-plating. In addition, the method can minimize a short-circuit occurrence rate caused by a plating-resist being peeled off and/or dissolved in plating solution.

Secondly, since the method in accordance with the present invention does not employ electroless plating process, it is possible to avoid environmental pollution caused by formalin contained in plating solution used for electroless copper-plating.

Thirdly, since the method employs electrolytic-plating, fabrication cost can be reduced by 30% to 50% in comparison with conventional electroless plating.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

First Embodiment

Figure 2A:
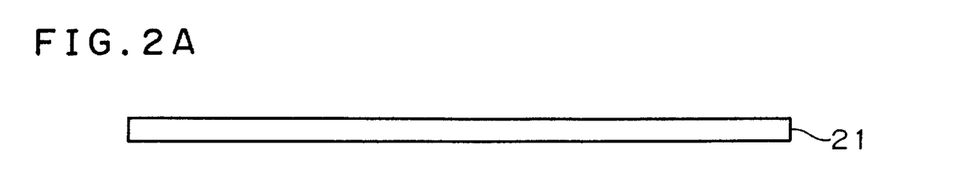
FIGS. 2A to 2O are cross-sectional views of a multi-layered printed wiring board, illustrating respective steps of a method of fabricating the same in accordance with the first embodiment of the present invention.
Figure 2B:
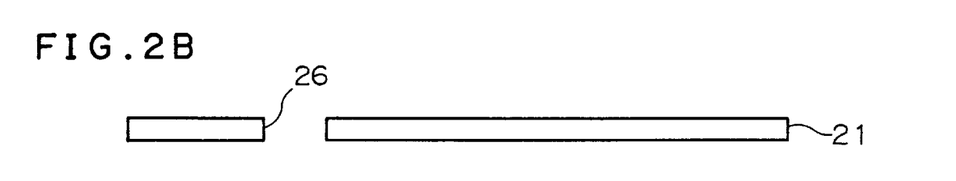
Figure 2C:
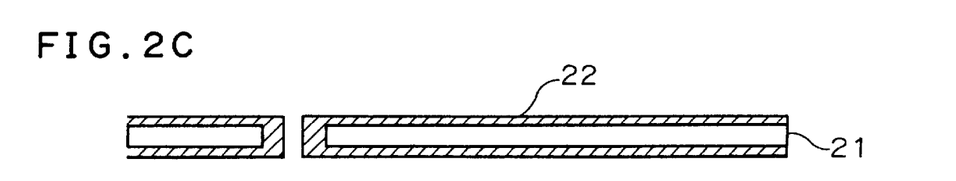

First, as illustrated in FIG. 2A, there is prepared a multi-layered insulating substrate 21 formed of epoxy resin and having a thickness in the range of 0.05 mm to 0.2 mm. As illustrated in FIG. 2B, the substrate 21 is formed at a desired location with a through-hole 26. Then, as illustrated in FIG. 2C, the substrate 21 is plated with copper to thereby cover both upper and lower surfaces of the substrate 21 and an inner wall surface of the through-hole 26 with a copper film 22.

Figure 2D:
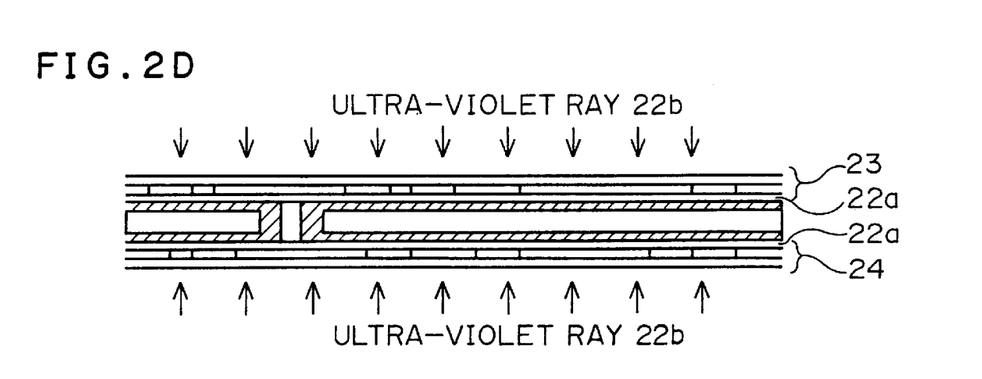

Then, as illustrated in FIG. 2D, the upper and lower surfaces of the substrate 21 is laminated with alkali-soluble dry films 22a, and thereafter, a mask film 23 for forming an external circuit layer is formed on the dry film 22a above the upper surface of the substrate 21, and a mask film 24 for forming an internal circuit layer is formed on the dry film 22a below the lower surface of the substrate 21. Then, the dry films 22a are exposed to ultra-violet ray 22b through the masks 23 and 24, as illustrated in FIG. 2D. Then, the dry films 22a are etched with copper chloride etching solution in an area other than areas which will make external and internal circuits. Subsequently, the dry films 22a covering areas which will make external and internal circuits are removed with sodium carbonate solution by a so-called tenting process. Thus, there is obtained a substrate on which desired external and internal circuits are formed, as illustrated in FIG. 2E.

Figure 2E:
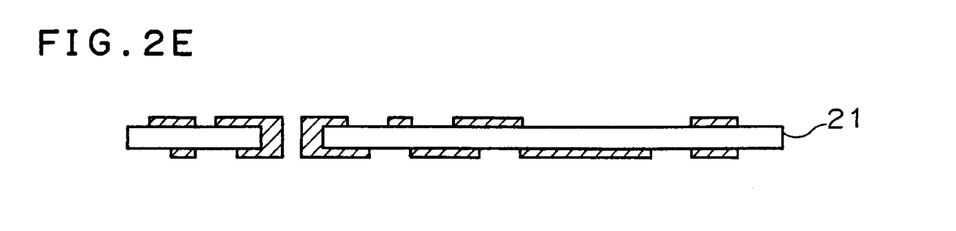
Figure 2F:
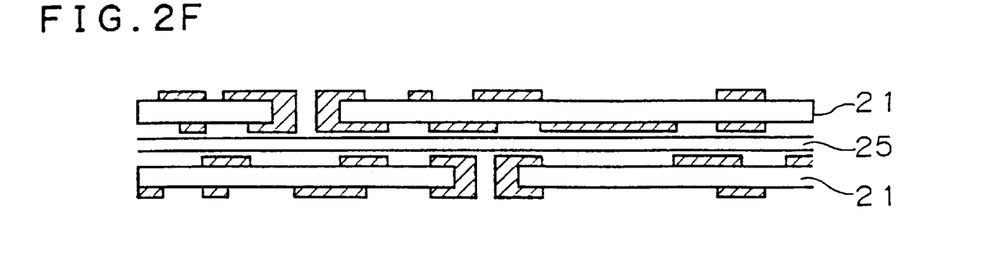
Figure 2G:
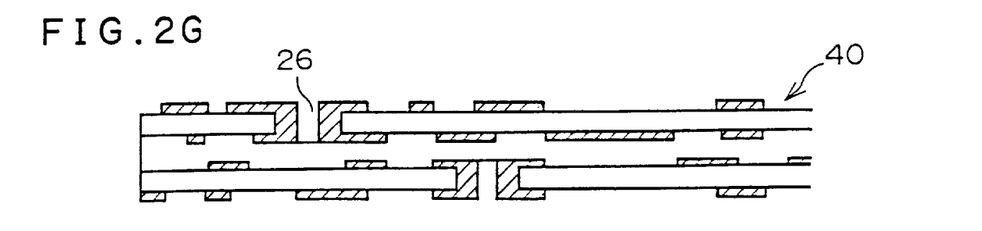

Then, the same substrate as one illustrated in FIG. 2E is formed in the same manner as above-mentioned. These two substrates are thermally compressed at 180° C. for 60 minutes with each other by means of a vacuum pressing machine with a prepreg 5 as a bonding sheet being sandwiched therebetween, as illustrated in FIG. 2F. As a result, there is formed a substrate 40 illustrated in FIG. 2G.

Figure 2H:
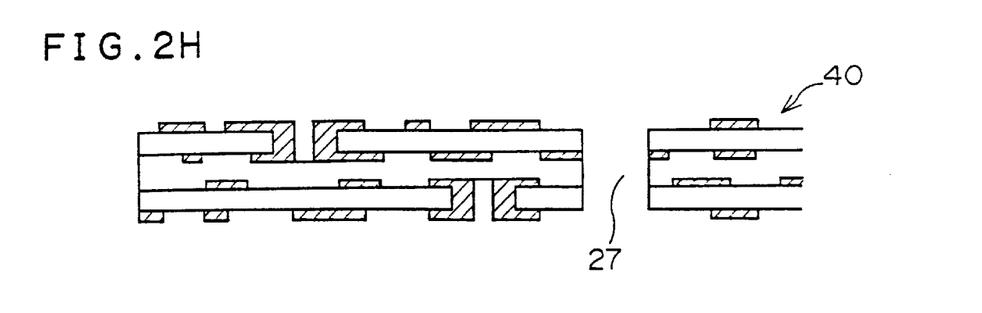
Figure 2I:
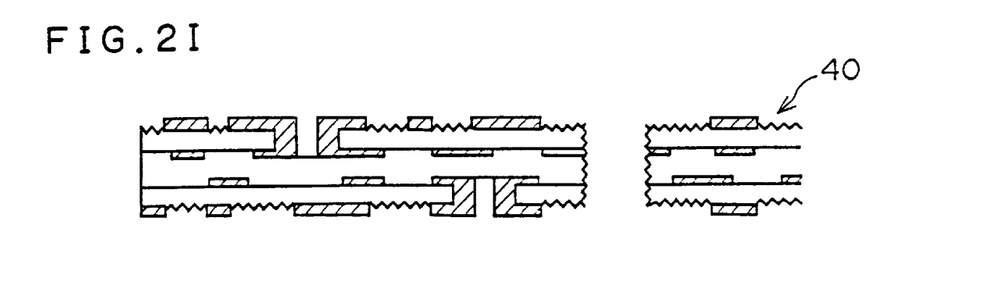

Then, as illustrated in FIG. 2H, the substrate 40 is formed at a desired location with a through-hole 27. Then, as illustrated in FIG. 2I, the substrate 40 is treated with alkali solution containing potassium permanganate at 10 to 30 g/L and sodium hydroxide at 10 to 20 g/L, at 60° C. to 80° C. for 3 to 5 minutes to thereby roughen the surfaces of the substrate 40 for enhancing adhesion between the surfaces of the substrate 40 and a later mentioned electrically conductive film 28.

Figure 2J:
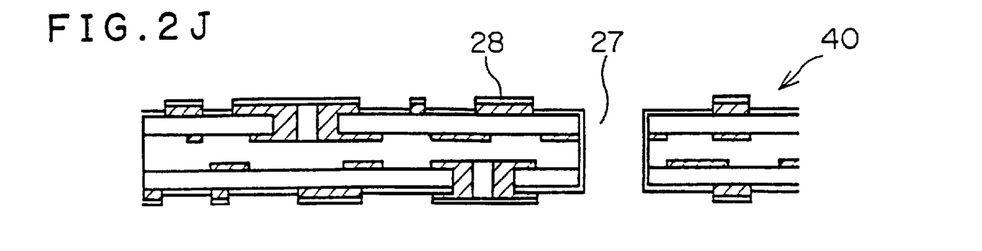

Then, a manganese dioxide film (not illustrated) is formed on both an inner wall surface of the through-hole 27 and the upper and lower surfaces of the substrate 40. Then, the substrate 40 is immerged into 30–50 mol % pyrrole solution. As a result, pyrrole is polymerized by manganese dioxide acting as an oxidizer. Thus, as illustrated in FIG. 2J, the upper and lower surfaces of the substrate 40 and the inner wall surface of the through-hole 27 are both covered with an electrically conductive film 28 made of polypyrrole derivative and containing no metal.

Herein, an electrically conductive film containing metal particles may be formed in place of the electrically conductive film 28 containing no metal.

Taking into consideration that irregularity of the roughened surfaces of the substrate 40 is equal to or smaller than 1 μm, and that a too thick electrically conductive film could not have sufficient adhesion with a later mentioned copper plating film 12, it is preferable that the electrically conductive film 28 has a thickness in the range of 0.05 μm to 0.5 μm for ensuring sufficient adhesion between the film 28 and the surfaces of the substrate 40. In order to form the electrically conductive film 28, there may be employed a polymeric monomer such as a pyrrole compound, an aniline compound, an thiophene compound, and a furan compound.

Figure 2K:
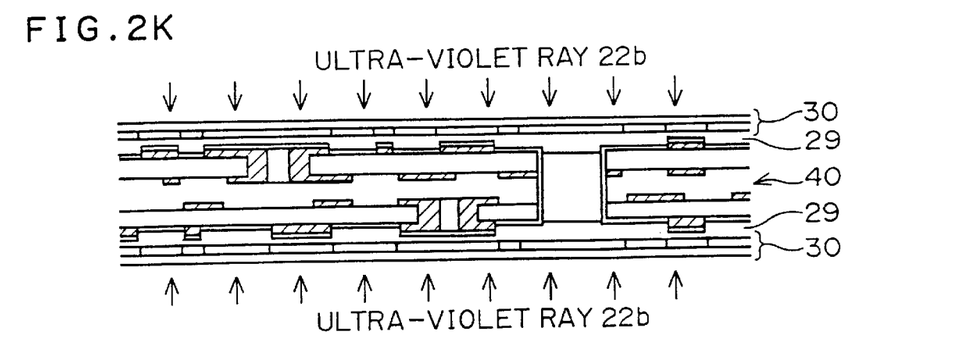

Then, as illustrated in FIG. 2K, the upper and lower surfaces of the substrate 40 is entirely laminated with dry films 29 having a thickness in the range of 25 μm to 50 μm. The dry film 29 is to be developed in alkali solution, and has plating resistance. Then, mask films 30 having a predetermined pattern are formed on the dry films 29.

Figure 2L:
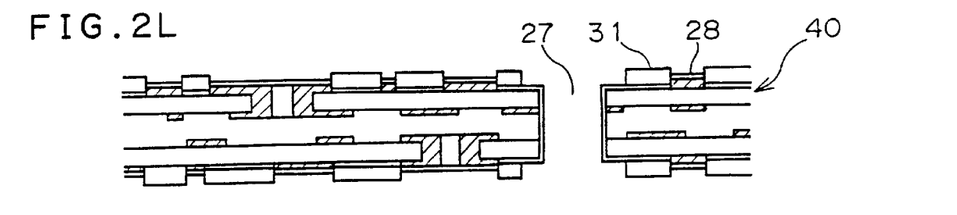

Thereafter, areas of the dry films 29 where a wiring circuit 34 having line/space of 50 μm/50 μm, a through-hole 33 having a diameter in the range of 0.2 mm to 2.0 mm, a blind via-hole 26 having a diameter in the range of 0.1 mm to 0.4 mm and a land portion thereof, and a pad 35 on which devices are to be mounted are formed are exposed to ultra-violet ray 22b through the mask films 30 to thereby cure portions of the dry films 30 which will make plating resist 31. Thereafter, unexposed or uncured portions of the dry films 30 are removed with developing agent such as 1–3 wt % Na$_2$CO$_3$ solution. Thus, there is formed the plating resist 31 in an area other than the wiring circuit 34, the through-hole 33, the blind via-hole 26 and a land portion thereof, and the pad 35, as illustrated in FIG. 2L.

Figure 2M:
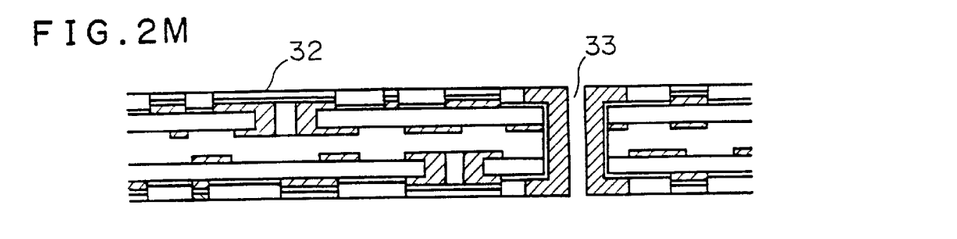

Then, the wiring circuit 34, the through-hole 33, the blind via-hole 26 and a land portion thereof, and the pad 35 are covered with a copper plating film 32 by electrolytic copper plating, employing copper plating solution containing copper sulfate at 65–85 g/L, sulfuric acid at 150–200 g/L, and chlorine at 30–50 ppm. The copper plating film 32 has a thickness in the range of 15 μm to 35 μm. Thus, the upper and lower surfaces of the substrate 40 are made electrically conductive, and are in electrical communication with each other by the copper plating film 32, as illustrated in FIG. 2M.

Figure 2N:
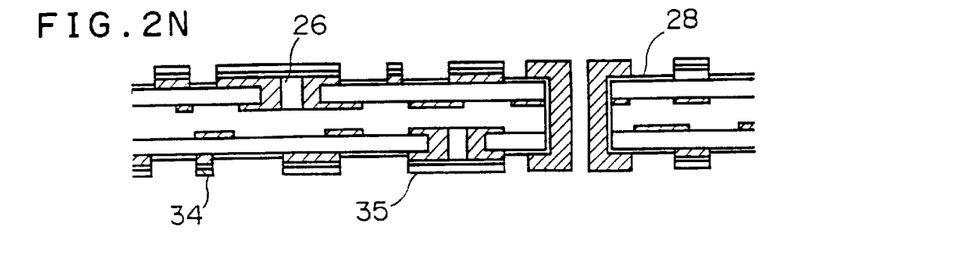
Figure 2O:
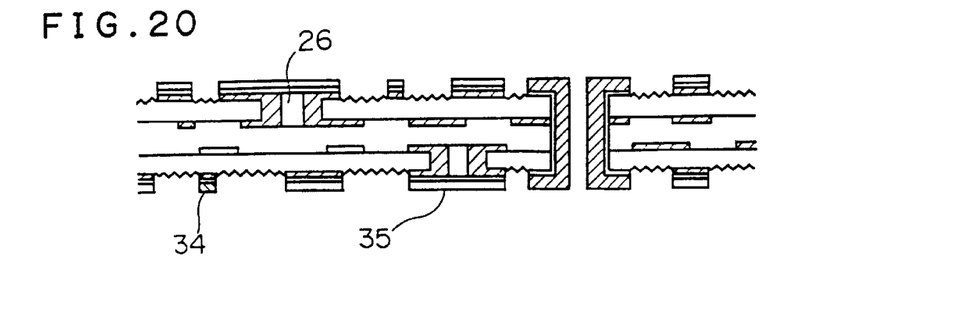

Then, as illustrated in FIG. 2N, the plating resist 31 is removed with 2–5% NaOH solution in order to ensure electrical isolation in the wiring circuit 34. Then, the electrically conductive film 28 located on the exposed surfaces of the substrate 40 is dissolved for removal with mixture solution of chromic acid and sulfuric acid. Thus, as illustrated in FIG. 2O, there is completed a multi-layered printed wiring board having the desired wiring circuit 34 and the blind via-hole 26.

Second Embodiment

The second embodiment is different from the first embodiment in that the plating resist 31 is formed in different areas on the upper and lower surfaces of the substrate 40.

Figure 3A:
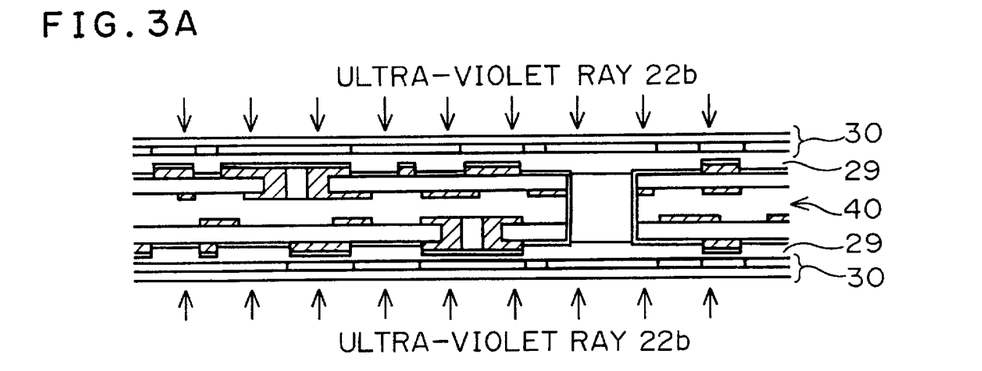
FIGS. 3A to 3E are cross-sectional views of a multi-layered printed wiring board, illustrating respective steps of a method of fabricating the same in accordance with the second embodiment of the present invention.

The method in accordance with the second embodiment has the same steps as the steps having been explained with reference to FIGS. 2A to 2J. Then, as illustrated in FIG. 3A, the upper and lower surfaces of the substrate 40 is entirely laminated with dry films 29 having a thickness in the range of 25 μm to 50 μm. The dry film 29 is to be developed in alkali solution, and has plating resistance. Then, mask films 30 having a predetermined pattern are formed on the dry films 29.

Figure 3B:
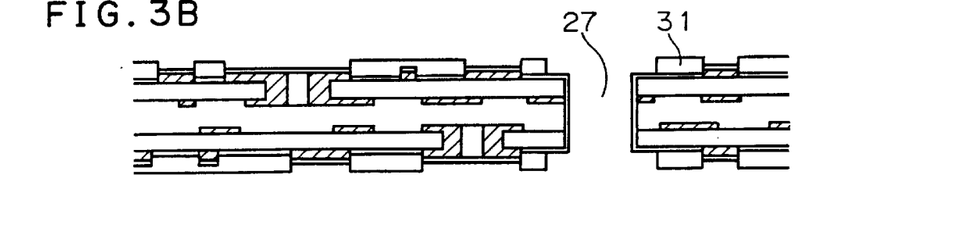

Thereafter, areas of the dry films 29 where a through-hole 33 having a diameter in the range of 0.2 mm to 2.0 mm, a blind via-hole 26 having a diameter in the range of 0.1 mm to 0.4 mm and a land portion thereof, and a pad 35 on which devices are to be mounted are formed are exposed to ultra-violet ray 22b through the mask films 30 to thereby cure portions of the dry films 30 which will make plating resist 31. Thereafter, unexposed or uncured portions of the dry films 30 are removed with developing agent such as 1–3 wt % Na$_2$CO$_3$ solution. Thus, there is formed the plating resist 31 in an area other than the through-hole 33, the blind via-hole 26 and a land portion thereof, and the pad 35, as illustrated in FIG. 3B.

Figure 3C:
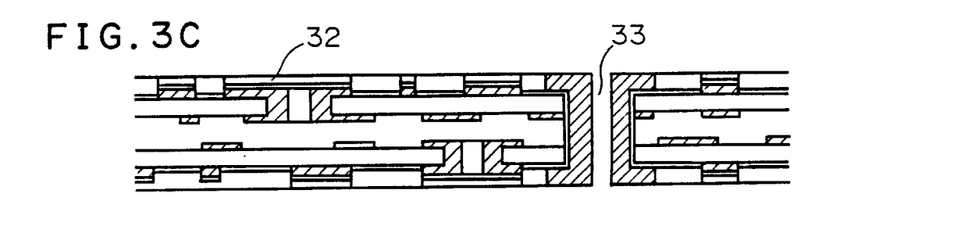

Then, the through-hole 33, the blind via-hole 26 and a land portion thereof, and the pad 35 are covered with a copper plating film 32 by electrolytic copper plating, employing copper plating solution containing copper sulfate at 65–85 g/L, sulfuric acid at 150–200 g/L, and chlorine at 30–50 ppm. The copper plating film 32 has a thickness in the range of 15 μm to 35 μm. Thus, the upper and lower surfaces of the substrate 40 are made electrically conductive, and are in electrical communication with each other by the copper plating film 32, as illustrated in FIG. 3C.

Figure 3D:
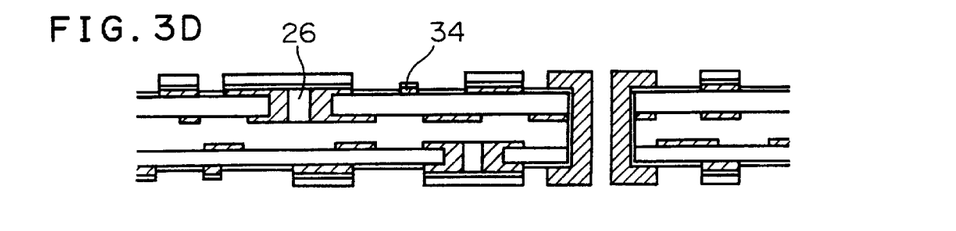
Figure 3E:
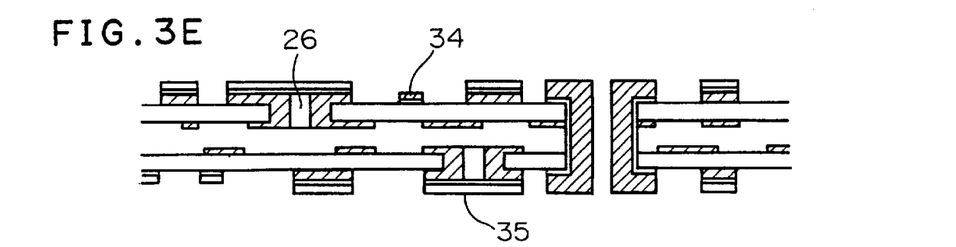

Then, as illustrated in FIG. 3D, the plating resist 31 is removed with 2–5% NaOH solution in order to ensure electrical isolation in the wiring circuit 34. Then, the electrically conductive film 28 located on the exposed surfaces of the substrate 40 is dissolved for removal with mixture solution of chromic acid and sulfuric acid. Thus, as illustrated in FIG. 3E, there is completed a multi-layered printed wiring board having the desired wiring circuit 34 and the blind via-hole 26.

In the second embodiment, the external circuit layer is not plated with the copper plating film 34 when the through-hole 33 is formed. Accordingly, it is possible to reduce a short-circuit occurrence rate of the external circuit layer by 10–14% in comparison with the first embodiment.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 9-16787 filed on Jan. 30, 1997 including specification, claims, drawings and summary is incorporated herein by reference in its entirety.

What is claimed is:

1. A method of fabricating a multi-layered printed wiring board, comprising the steps of:
   (a) forming a multi-layered substrate with a hole which will make a blind via-hole;
   (b) plating said multi-layered substrate;
   (c) forming an internal layer circuit pattern and an external layer circuit pattern;
   (d) laying one multi-layered substrate on another and bonding the multi-layered substrate(s) to one another electrically isolated from one another;
   (e) forming a product of said step (d) with a through-hole; and
   (f) forming a plated electrically conductive film on both said external layer circuit pattern and an inner wall surface of said through-hole.

2. The method as set forth in claim 1, wherein said electrically conductive film is a non-metallic one.

3. The method as set forth in claim 2, wherein said step (f) includes the steps of:
   (f-1) forming a manganese dioxide film on surfaces of a product of said step (e) including an inner wall surface of said through-hole; and
   (f-2) immerging a product of said step (f-1) into pyrrole solution to thereby polymerize pyrrole and form a non-metallic, electrically conductive film composed of polypyrrole derivative.

4. The method as set forth in claim 2, wherein said non-metallic, electrically conductive film is composed of a polymeric monomer selected from the group consisting of a pyrrole compound, an aniline compound, a thiophene compound, and a furan compound.

5. The method as set forth in claim 1, wherein said electrically conductive film contains metallic particles therein.

6. The method as set forth in claim 1, wherein said electrically conductive film has a thickness in the range of 0.05 $\mu$m to 0.5 $\mu$m both inclusive.

7. The method as set forth in claim 1, wherein said step (f) includes the steps of:
   (i) forming an electrically conductive layer on surfaces of a product of said step (e) including an inner wall surface of said through-hole; and
   (ii) electrolytic-plating said electrically conductive layer step (i).

8. A method of fabricating a multi-layered printed wiring board, comprising the steps of:
   (a) forming a multi-layered substrate with a hole which will make a blind via-hole;
   (b) plating said multi-layered substrate;
   (c) forming an internal layer circuit pattern and an external layer circuit pattern;
   (d) laying one multi-layered substrate on another and bonding the multi-layer substrate(s) to one another electrically isolated from one another;
   (e) forming a product of said step (d) with a through-hole;
   (f) covering surfaces of a product of said step (e) including an inner wall surface of said through-hole with an electrically conductive film;
   (g) plating said external layer circuit pattern and said inner wall surface of said through-hole; and
   (h) removing said electrically conductive film formed on said surfaces of said product of said step (f).

9. The method as set forth in claim 8, wherein said electrically conductive film is a non-metallic one.

10. The method as set forth in claim 9, wherein said step (f) includes the steps of:
    (f-1) forming a manganese dioxide film on said surfaces of said product of said step (e); and
    (f-2) immerging a product of said step (f-1) into pyrrole solution to thereby polymerize pyrrole and form a non-metallic, electrically conductive film composed of polypyrrole derivative.

11. The method as set forth in claim 9, wherein said non-metallic, electrically conductive film is composed of a polymeric monomer selected from the group consisting of a pyrrole compound, an aniline compound, a thiophene compound, and a furan compound.

12. The method as set forth in claim 8, wherein said electrically conductive film contains metallic particles therein.

13. The method as set forth in claim 8, wherein said electrically conductive film has a thickness in the range of 0.05 $\mu$m to 0.5 $\mu$m both inclusive.

14. The method as set forth in claim 8, further comprising the steps of:
    (i) forming a resist in an area other than said external layer circuit pattern and said through-hole; and
    (j) removing said resist,
    said step (i) being to be carried out between said steps (f) and (g), said step (j) being to be carried out between said steps (g) and (h).

15. The method as set forth in claim 8, wherein electrolytic-plating is carried out in said step (g).

16. A method of fabricating a multi-layered printed wiring board, comprising the steps of:
    (a) forming a multi-layered substrate with a hole which will make a blind via-hole;
    (b) plating said multi-layered substrate;
    (c) forming an internal layer circuit pattern and an external layer circuit pattern;
    (d) laying one multi-layered substrate on another and bonding the multi-layered substrate(s) to one another electrically isolated from one another;
    (e) forming a product of said step (d) with a through-hole; and
    (f) forming an electrically conductive film on said external layer circuit pattern, and forming a plated electrically conductive film on an inner wall surface of said through-hole.

17. The method as set forth in claim 16, wherein said electrically conductive film is a non-metallic one.

18. The method as set forth in claim 17, wherein said step (f) includes the steps of:
    (f-1) forming a manganese dioxide film on said inner wall surface of said through-hole; and (f-2) immerging a product of said step (f-1) into pyrrole solution to thereby polymerize pyrrole and form a non-metallic, electrically conductive film composed of polypyrrole derivative.

19. The method as set forth in claim 17, wherein said non-metallic, electrically conductive film is composed of a polymeric monomer selected from the group consisting of a pyrrole compound, an aniline compound, a thiophene compound, and a furan compound.

20. The method as set forth in claim 16, wherein said electrically conductive film contains metallic particles therein.

21. The method as set forth in claim 16, wherein said electrically conductive film has a thickness in the range of 0.05 $\mu$m to 0.5 $\mu$m both inclusive.

22. The method as set forth in claim 16, wherein said inner wall surface of said through-hole is plated by means of electrolytic-plating.

23. A method of fabricating a multi-layered printed wiring board, comprising the steps of:
    (a) forming a multi-layered substrate with a hole which will make a blind via-hole;
    (b) plating said multi-layered substrate;
    (c) forming an internal layer circuit pattern and an external layer circuit pattern;
    (d) laying one multi-layered substrate on another and bonding the multi-layered substrate(s) to one another electrically isolated from one another;
    (e) forming a product of said step (d) with a through-hole;
    (f) covering surfaces of a product of said step (e) including an inner wall surface of said through-hole with an electrically conductive film;
    (g) plating said external layer circuit pattern and said inner wall surface of said through-hole; and
    (h) removing said electrically conductive film formed on said surfaces of said product of said step (f).

24. The method as set forth in claim 23, wherein said electrically conductive film is a non-metallic one.

25. The method as set forth in claim 24, wherein said step (f) includes the steps of:
    (f-1) forming a manganese dioxide film on said inner wall surface of said through-hole; and
    (f-2) immerging a product of said step (f-1) into pyrrole solution to thereby polymerize pyrrole and form a non-metallic, electrically conductive film composed of polypyrrole derivative.

26. The method as set forth in claim 24, wherein said non-metallic, electrically conductive film is composed of a polymeric monomer selected from the group consisting of a pyrrole compound, an aniline compound, a thiophene compound, and a furan compound.

27. The method as set forth in claim 23, wherein said electrically conductive film contains metallic particles therein.

28. The method as set forth in claim 23, wherein said electrically conductive film has a thickness in the range of 0.05 $\mu$m to 0.5 $\mu$m both inclusive.

29. The method as set forth in claim 23, further comprising the steps of:
    (i) forming a resist in an area other than said through-hole; and
    (j) removing said resist,
    said step (i) being to be carried out between said steps (f) and (g), said step (j) being to be carried out between said steps (g) and (h).

30. The method as set forth in claim 23, wherein electrolytic-plating is carried out in said step (g).

* * * * *